United States Patent [19]
Honda et al.

[11] Patent Number: 6,103,680
[45] Date of Patent: Aug. 15, 2000

[54] NON-CORROSIVE CLEANING COMPOSITION AND METHOD FOR REMOVING PHOTORESIST AND/OR PLASMA ETCHING RESIDUES

[75] Inventors: Kenji Honda, Warwick, R.I.; Eugene F. Rothgery, Branford, Conn.

[73] Assignee: Arch Specialty Chemicals, Inc., Norwalk, Conn.

[21] Appl. No.: 09/224,493

[22] Filed: Dec. 31, 1998

[51] Int. Cl.$^7$ .............................. C11D 3/30; C11D 3/43; B08B 3/08
[52] U.S. Cl. .......................... 510/178; 510/175; 510/212; 510/255; 510/258; 510/434; 510/477; 510/499; 134/1.1; 134/1.3
[58] Field of Search .................................. 510/176, 212, 510/254, 255, 258, 271, 493, 434, 477, 480, 499, 175, 505; 134/1.1, 1.2, 1.3, 2

[56] References Cited

U.S. PATENT DOCUMENTS

| | | | |
|---|---|---|---|
| 3,629,111 | 12/1971 | Cramer | 252/75 |
| 4,022,711 | 5/1977 | Noack | 252/389 |
| 4,022,712 | 5/1977 | Noack | 252/389 |
| 4,239,661 | 12/1980 | Sugino et al. | 438/471 |
| 4,317,741 | 3/1982 | Lederle et al. | 252/77 |
| 4,810,405 | 3/1989 | Waller et al. | 252/81 |
| 4,904,571 | 2/1990 | Miyashita et al. | 430/331 |
| 5,091,103 | 2/1992 | Dean et al. | 510/175 |
| 5,139,607 | 8/1992 | Ward et al. | 216/83 |
| 5,174,816 | 12/1992 | Aoyama et al. | 106/217.6 |
| 5,279,771 | 1/1994 | Lee | 510/212 |
| 5,464,480 | 11/1995 | Matthews | 134/1.3 |
| 5,466,389 | 11/1995 | Ilardi et al. | 252/156 |
| 5,612,304 | 3/1997 | Honda et al. | 510/176 |
| 5,648,324 | 7/1997 | Honda et al. | 510/176 |
| 5,691,117 | 11/1997 | Lutsic et al. | 430/329 |
| 5,911,835 | 6/1999 | Lee et al. | 134/1.3 |

FOREIGN PATENT DOCUMENTS

| | | |
|---|---|---|
| 2132768 | 4/1995 | Canada. |
| 0 647 884 B1 | 4/1998 | European Pat. Off.. |
| 7-028254 | 1/1995 | Japan. |
| WO 88/05813 | 8/1988 | WIPO. |

*Primary Examiner*—William Krynski
*Assistant Examiner*—Dawn L. Garrett
*Attorney, Agent, or Firm*—Ohlandt, Greeley, Ruggiero & Perle, L.L.P.

[57] ABSTRACT

Non-corrosive cleaning compositions that are useful for removing photoresist and/or plasma etch residues from a substrate. The cleaning composition comprises: (i) a hydroxy-(lower alkyl)-hydrazine, (ii) water, and (iii) at least one compound selected from the group consisting of a carboxylic acid, a water-miscible organic solvent and mixtures thereof.

17 Claims, No Drawings

NON-CORROSIVE CLEANING COMPOSITION AND METHOD FOR REMOVING PHOTORESIST AND/OR PLASMA ETCHING RESIDUES

BACKGROUND OF THE INVENTION

1. Field of the Invention

This invention relates to a cleaning composition and method for its use in microelectronics manufacturing, and more particularly to a non-corrosive cleaning composition and method for removing photoresist and/or plasma etch residues on substrates.

2. Description of Art

In the manufacture of microcircuits, positive photoresists are used as an intermediate mask for transferring an original mask pattern of a reticle onto wafer substrates by means of a series of photolithography and plasma etching steps. One of the steps in the microcircuit manufacturing process is the removal of the patterned photoresist films from substrates. In general, this step is conducted by one of two methods. One method involves a wet stripping step in which the photoresist-covered substrate is brought into contact with a photoresist stripper solution that consists primarily of an organic solvent and an amine. However, stripper solutions cannot completely and reliably remove the photoresist films, especially if the photoresist films have been exposed to UV radiation and plasma treatments during fabrication. Some photoresist films become highly cross-linked by such treatments and are more difficult to dissolve in the stripper solution. In addition, the chemicals used in these conventional wet stripping methods are sometimes ineffective for removing inorganic residual materials formed during the plasma etching of metal or oxide layers with halogen-containing gases.

An alternative method of removing a photoresist film involves exposing a photoresist-coated wafer to oxygen plasma in order to burn the resist film from the substrate surface in a process known as oxygen plasma ashing. Oxygen plasma ashing has become more popular in the microcircuit manufacturing process because it is carried out in a vacuum chamber and, hence, is expected to be less susceptible to airborne particulate or metallic contamination. However, oxygen plasma ashing is also not fully effective in removing plasma-etching residues noted above. Instead, removal of these plasma-etching residues must be accomplished by subsequently exposing the photoresist film to certain solutions. Several commercial products are now available to clean the plasma etching residues left by plasma etching followed by oxygen ashing. For example, EKC 265, available from EKC Technology, Inc., is a plasma etching cleaning solution composed of water, alkanolamine, catechol and hydroxylamine. Such a composition is disclosed in U.S. Pat. No. 5,279,771 to Lee. ACT 935, available from Ashland Chemical, is another plasma etching cleaning solution and is composed of water, alkanolamine and hydroxylamine. In both cases, hydroxylamine is used as a corrosion inhibitor. R-10, a post-strip rinse available from Mitsubishi Gas Chemical, is composed of water, alkanolamine and a sugar alcohol, wherein the sugar alcohol acts as a corrosion inhibitor.

Although these commercial products can effectively dissolve plasma-etching residues, the combination of water and alkanolamine contained therein can also attack the metallic layers deposited patternwise on the substrate. The addition of a corrosion inhibitor to these products can mitigate to a certain extent, the unwanted attack on the metallic layers and oxide layers deposited on the substrate. However, since these products have a pH above 11, even in the presence of a corrosion inhibitor, they may attack certain corrosion-sensitive metal layers. Particularly, metal layers such as aluminum or aluminum alloys (e.g., Al—Cu—Si), titanium nitride, titanium tungsten and the like are particularly corrosion sensitive. Furthermore, while the addition of a suitable corrosion inhibitor is essential to prevent corrosion of the substrate metal layers, the corrosion inhibitor must not inhibit the removal of the plasma-etching residue.

It is difficult to balance effective plasma etching residue removal and corrosion inhibition because chemical compositions of the plasma etching residues are generally similar to those of the metal layers or oxide layers on the substrate. The alkanolamine used in the prior art cleaning compositions was oftentimes found to attack both the plasma etching residues and the substrate metal layers in the presence of water. Moreover, if a post-cleaner rinse such as isopropyl alcohol was not used, the corrosion could be very severe. In addition, some types of the corrosion inhibitors have been found to retard plasma etching residue removal. There has also always been a tradeoff between speed of plasma etching residue removal and substrate metal layer corrosion inhibition. Accordingly, there remains a need for a method of quickly and effectively removing the plasma etching residues without causing metal layer corrosion.

Several other patents in the photoresist stripper/cleaner application field exist as follows, although none of them disclose the use of the method or compositions of the present invention:

Japanese Patent Application No. 7-028254, assigned to Kanto Kagaku, discloses a non-corrosive resist removal liquid comprising a sugar alcohol, an alcohol amine, water, and a quaternary ammonium hydroxide.

PCT Published Patent Application No. WO 88-05813 teaches a positive or negative photoresist stripper containing butyrolactone or caprolactone, quaternary ammonium hydroxide compound, and optionally, a nonionic surfactant.

U.S. Pat. No. 4,239,661 to Muraoka et al. discloses a surface-treating agent comprising an aqueous solution of 0.01% to 20% trialkyl (hydroxyalkyl) ammonium hydroxide. This agent is useful in removing organic and inorganic contaminants deposited on the surface of intermediate semiconductor products.

U.S. Pat. No. 4,904,571 to Miyashita et al. teaches printed circuit board photoresist stripper composition containing a solvent (e.g., water, alcohols, ethers, ketones, and the like), an alkaline compound dissolved in the solvent, including quaternary ammonium hydroxide, and a borohydride compound dissolved in the solvent.

U.S. Pat. No. 5,091,103 to Dean et al. teaches a positive photoresist stripping composition containing: (A) N-alkyl-2-pyrrolidone; (B) 1,2-propanediol; and (C) tetraalkylammonium hydroxide.

U.S. Pat. No. 5,139,607 to Ward et al. teaches positive and negative photoresist stripping composition containing: (A) tetrahydrofurfuryl alcohol; (B) a polyhydric alcohol (e.g., ethylene glycol or propylene glycol); (C) the reaction product of furfuryl alcohol and an alkylene oxide; (D) a water-soluble Bronstead base type hydroxide compound (e.g., alkali metal hydroxide, ammonium hydroxide and tetramethyl ammonium hydroxide); and (E) water. Optionally, the composition may also contain up to 1% of a nonionic surfactant.

U.S. Pat. No. 5,174,816 to Aoyama et al. discloses a composition for removing chlorine remaining on the surface of an aluminum line pattern substrate after dry etching, which composition comprises an aqueous solution containing 0.01 to 15% by weight of a quaternary ammonium hydroxide, such as trimethyl (2-hydroxyethyl) ammonium hydroxide, and 0.1 to 20% by weight of sugar or sugar alcohol, such as xylitol, mannose, glucose and the like.

Canadian Patent Application 2,132,768 of Schwartzkopf et al., published Aug. 4, 1995, discloses the use of 1–10% by weight of reducing agents in photoresist stripping compositions and hydrazine and its derivatives are mentioned as one of several types of reducing agents useful. The stripping compositions of Schwartzkopf et al. comprise a polar solvent, nucleophilic amine compounds, such as hydroxylamines, and the reducing agent.

The present invention avoids the need to add a nucleophilic amine to the cleaning composition since it has been found that a hydroxyalkyl hydrazine is highly effective in dissolving the photoresist. It also avoids the need to use a post-strip intermediate rinse step with an organic solvent such as isopropanol due to a strong power of corrosion inhibition of hydroxyalkyl hydrazine.

SUMMARY OF THE INVENTION

In accordance with the present invention, there has been discovered a non-corrosive cleaning composition that is useful for removing photoresist and/or plasma etch residues from a substrate which comprises: (i) a hydroxy-(lower alkyl)-hydrazine; (ii) water; and (iii) at least one compound selected from the group consisting of a carboxylic acid, a water-miscible organic solvent and mixtures thereof.

The invention further contemplates a method of removing residues from a substrate comprising contacting a substrate containing residues with the above-mentioned cleaning composition.

DETAILED DESCRIPTION OF THE PREFERRED EMBODIMENT

Suitable hydroxy-(lower alkyl)-hydrazines for use in this invention are hydroxyethylhydrazine, hydroxypropyl hydrazine and hydroxybutyl hydrazine, dihydroxy-(lower alkyl)-hydrazine, such as di-(hydroxyethyl)-hydrazine, di-(hydroxypropyl)-hydrazine, and di-(hydroxy-butyl) hydrazine). The preferred hydroxy-(lower alkyl) hydrazine is hydroxyethyl hydrazine. The lower alkyl may have about 1–6 carbon atoms, and is preferably ethyl, propyl or butyl.

Some amounts of the hydroxy-(lower alkyl) hydrazine can be replaced with water-miscible solvents, mentioned below, because the viscosity of hydroxy-(lower alkyl) hydrazine is very high and lowering the viscosity of the resulting solution can increase the cleaning efficiency. These solvents are especially helpful when photoresist remains on the surface of the substrate.

Suitable water-miscible solvents used in the cleaning composition of the invention are illustrated by N-methyl-2-pyrrolidinone (NMP), N-hydroxyethyl-2-pyrrolidinone (HEP), 1,3-dimethyl-2-imidazolidinone (DMI), dimethylsulfoxide (DMSO), N,N-dimethylacetamide (DMAC), diacetone alcohol, (DAAL), ethylene glycol (EG), propylene glycol (PG) or combinations thereof. NMP and DMSO solvents are especially effective in terms of photoresist stripping power and are preferred in the present invention.

The amount of water in the cleaning composition depends on whether photoresist remains on the surface of the substrate. In general, water is used in amounts of 1 to 90% by weight and preferably 5 to 80% by weight based upon the total weight of the cleaning composition. If photoresist remains on the substrate, the amount of water required is about 1 to 30% because photoresist stripping power of the composition significantly degrades if the water content exceeds 30% by weight. In contrast, if there is no photoresist remaining on the wafer, the water content can be increased above 30 wt. % as the plasma etch residues become more soluble with increasing water content in an admixture of hydroxyalkyl hydrazine and water.

Acids may also be used in the cleaning composition of the present invention to decrease the pH of the hydrazine solutions, which reduces the amount of corrosion on metal substrates. Any suitable acid may be used such as organic and inorganic acids. The preferable acids are carboxylic acids, and more preferably the carboxylic acids are considered chelating agents. Suitable carboxylic acid chelating agents are citric acid, tartaric acid, lactic acid, oxalic acid, ethylenediaminetetraacetic acid (EDTA), nitrilotriacetic acid and related compounds. Preferably, the carboxylic acid chelating agent is present in the composition in the amount of about 1 to 40 wt. %, preferably 3 to 30 wt. %, and more preferably 5 to 20 wt. % based on the total weight of cleaning composition.

Preferably, when the substrate contains photoresist, the cleaning composition comprises: water; hydroxy-(lower alkyl)-hydrazine; and a water-miscible solvent. The amount of water is about 1 to 30 wt. %, preferably 2 to 20 wt. %, and more preferably 5 to 15 wt. %. The amount of hydroxy-(lower alkyl)-hydrazine is about 30 to 70 wt. %, more preferably 40 to 60 wt. %, and even more preferably 45 to 55 wt. %. The amount of water-miscible solvent is about 30 to 70 wt. %, more preferably 40 to 60 wt. % and even more preferably 45 to 55 wt. %. All wt. % are based on the total weight of the cleaning composition.

When the cleaning composition is primarily removing plasma etch residues, it preferably comprises: hydroxy-(lower alkyl)-hydrazine; water; and a carboxylic acid. The amount of water is about 30 to 90 wt. %, and preferably 60 to 90 wt. %. The amount of hydroxy-(lower alkyl)-hydrazine is about 5 to 50 wt. %, preferably about 5 to 30 wt. % and more preferably about 5 to 20 wt. %. The amount of carboxylic acid is about 1 to 40 wt. %, preferably 1 to 30 wt. %, and more preferably 1 to 20 wt. %. All wt. % are based on the total weight of the cleaning composition. The preferred carboxylic acid is the carboxylic acid chelating agents mentioned above.

A surfactant may also be optionally included in the cleaning composition so as to enhance the power of the particulate residue removal from the substrate. Suitable surfactants are selected from nonionic types, cationic types and anionic types of surfactants. Preferably, a surfactant is present in the cleaning composition of the present invention in the amount of about 1 ppm to 500 ppm by weight based on the total weight of the cleaning composition.

Another optional agent that may be included in the cleaning composition is a corrosion inhibitor. The preferred corrosion inhibitors are salicyl alcohol, salicyl aldoxime, gallic acid, gallic acid esters and pyrogallol.

This invention further contemplates the method of removing residues from a substrate comprising: applying one of the above mentioned cleaning solutions to the substrate containing photoresist and/or plasma etch residues.

The cleaning method of the present invention can also be used in combination with a dry stripping process if photoresist or other organic polymer residues remain on the surface. Dry stripping is typically conducted prior to the present cleaning method. Any suitable dry stripping process can be used including $O_2$ plasma ashing, ozone gas phase-treatment, fluorine plasma treatment, hot $H_2$ gas treatment (described in U.S. Pat. No. 5,691,117), and the like.

Furthermore, the cleaning method can also be used in combination with ozonated water, which is used to strip off photoresist and other residues. The ozonated water can be a simple mixture of ozone and ultra-pure water, e.g., DI water. Ozone can be generated by any conventional means, e.g., an ozone generator. The mixing of ozone and water may be achieved by any suitable method, such as jetting ozone into water by a gas feed nozzle; feeding water and ozone into a spiral mixer; aspirating the gas into the flow of water; and feeding ozone into a treatment tank regulated at a given pressure so that ozone is dissolved into water. The ozonated water can then be contacted with the substrate by any suitable method such as placing the ozonated water into a tank and submerging the substrates into the ozonated water, or by use of a spray rinse.

The invention is further illustrated by the following examples which are not to be considered as limitative of its scope.

EXAMPLE 1

A stripping/cleaning solution was prepared by mixing water, hydroxyethyl hydrazine (HEH) and N-methyl-2-pyrrolidinone (NMP) to prepare a mixture having 47.5% HEH, 47.5% NMP and 5% water.

Silicon wafers having a multi-layer structure of Al—Si—Cu/$SiO_2$/Si were prepared by plasma deposition method and further top-coated with a positive photoresist at a film thickness of 1.0 micron by spin coating method. Micropatterning was applied to the photoresist layer lithographically followed by pattern transfer onto the metal layer by plasma etching with the pre-patternized photoresist mask. The wafer thus obtained contained both photoresist residues (PR) and plasma etch residues (PER). The chemical composition of the resulting PER were identified to be $Si_xAlO_yCl_z$ using x-ray spectroscopy, but the exact composition of $Si_xAlO_yCl_z$ could not be determined quantitatively.

The residues-containing wafers were cut into 1 cm. by 1 cm. pieces and placed in a 200 ml. beaker which contained 100 ml. of the above-prepared solution in a temperature controlled bath at 80° C. The pieces of wafers were immersed in the solution with a gentle agitation (200 rpm) for 15 minutes. The wafer pieces were transferred to another beaker that contained deionized water at room temperature and gently stirred for 5 minutes. The wafer pieces were then removed from the water and dried by blowing nitrogen gas onto the surface of the wafer pieces.

The wafer pieces were inspected under a scanning electron microscope (SEM) after gold sputtering. Top-down and cross-section views of the wafer SEM pictures were obtained to visualize the PR and PER on the wafer surface. In addition, the exposed metal layer surface was inspected under SEM to evaluate any corrosion of the metal surface.

The SEM inspection results indicated that the formulation described above resulted in very good removal of both PR and PER without metal corrosion even if the post-strip intermediate rinse with an organic solvent such as isopropyl alcohol (IPA) was not applied. The results are summarized in Table 1 below.

EXAMPLES 2–4

Examples 2–5 illustrate additional compositions tested with the same type of wafers containing both PR and PER under the same conditions as described in Example 1 except that the strip time with the DMSO(dimethyl sulfoxide)-based compositions was 20 minutes. Detailed formulations and test results are in summarized Table 1 below.

EXAMPLE 5

A cleaning solution was prepared by mixing 10. 2 g of HEH and 9.8 g of EDTA in 80 g of water until a completely clear solution was obtained by stirring at room temperature. The residue-containing wafer prepared in example 1 was treated with ozonated water at room temperature for 30 minutes to remove the photoresist. This was followed by immersion in the solution prepared above at 50° C. for 30 minutes with gentle agitation. The wafer was rinsed with water and dried by nitrogen gas.

The wafer was then inspected by SEM in the same manner as was described in Example 1. The inspection showed that there were no residues remaining on the wafer surface and no corrosion of the metal layer. The result and formulation is summarized in table 1 below:

TABLE 1

| Ex. No. | Formulation, wt. % | | | | SEM Inspection Result | | |
|---|---|---|---|---|---|---|---|
| | HEH | H2O | Solvent | Acid | PR | PER | CORROSION |
| 1 | 47.5 | 5 | 47.5 (NMP) | 0 | V. Good | V. Good | OK |
| 2 | 45 | 10 | 45 (NMP) | 0 | Good | Great | OK |
| 3 | 47.5 | 5 | 47.5 (DMSO) | 0 | Good | Marginal | OK |
| 4 | 45 | 10 | 45 (DMSO) | 0 | Good | Good | OK |
| 5 | 10.2 | 80 | 0 | 9.8 | NA | V. Good | OK |

Score of performance: Great > V.Good > Good > Marginal. "Marginal" means that a small amount of the residue remained but it could be removed at higher temperatures and/or for longer times.

While the invention has been described above with reference to specific embodiments thereof, it is apparent that many changes, modifications and variations can be made without departing from the inventive concept disclosed herein. Accordingly, it is intended to embrace all such changes, modifications and variations that fall within the spirit and broad scope of the appended claims. All patent applications, patents and other publications cited herein are incorporated by reference in their entirety.

What is claimed is:

1. A non-corrosive cleaning composition comprising:
    (i) a hydroxy-(lower alkyl)-hydrazine;
    (ii) water; and
    (iii) at least one carboxylic acid selected from the group consisting of:
   citric acid, lactic acid, succinic acid, tartaric acid, ethylenediaminetetraacetic acid, nitrilotriacetic acid, and mixtures thereof.

2. The composition of claim 1 wherein said hydroxy-(lower alkyl)-hydrazine is selected from the group consisting of: hydroxyethyl hydrazine, hydroxypropyl hydrazine, hydroxybutyl hydrazine, di-(hydroxyethyl)-hydrazine, di-(hydroxypropyl)-hydrazine, and di-(hydroxy-butyl) hydrazine).

3. The composition of claim 2 wherein the amount of said hydroxy-(lower alkyl)-hydrazine is between about 5 to 50 wt. %, the amount of water is between about 30 to 90 wt. % and the amount of said carboxylic acid is between about 1 to 40 wt. % based on the total weight of the cleaning composition.

4. The composition of claim 1 wherein said hydroxy-(lower alkyl)-hydrazine is hydroxyethyl hydrazine and said carboxylic acid is ethylenediaminetetraacetic acid.

5. The composition of claim 1, further comprising a water-miscible solvent selected from the group consisting of: N-methyl-2-pyrrolidinone (NMP), N-hydroxyethyl-2-pyrrolidinone, 1,3-dimethyl-2-imidazolidinone, dimethylsulfoxide (DMSO), N,N-dimethylacetamide, diacetone alcohol, ethylene glycol, propylene glycol, and combinations thereof.

6. The composition of claim 5 wherein the amount of said hydroxy-(lower alkyl)-hydrazine is between about 30 to 70 wt. %, the amount of water is between about 1 to 30 wt. % and the amount of said water-miscible solvent is between about 30 to 70 wt. % based on the total weight of the cleaning composition.

7. The composition of claim 5 wherein said hydroxy-(lower alkyl)-hydrazine is hydroxyethyl hydrazine and said water-miscible solvent is NMP or DMSO.

8. The composition of claim 1 further comprising a surfactant, a corrosion inhibitor or a combination thereof.

9. A method of removing residues from a substrate comprising the step of contacting said substrate containing said residues with a non-corrosive cleaning composition comprising:

(i) a hydroxy-(lower alkyl)-hydrazine;
   (ii) water; and
   (iii) at least one carboxylic acid selected from the group consisting of:
citric acid, lactic acid, succinic acid, tartaric acid, ethylenediaminetetraacetic acid, nitrilotriacetic acid, and mixtures thereof.

10. The method of claim 9 wherein said hydroxy-(lower alkyl)-hydrazine is selected from the group consisting of: hydroxyethyl hydrazine, hydroxypropyl hydrazine, hydroxybutyl hydrazine, di-(hydroxyethyl)-hydrazine, di-(hydroxypropyl)-hydrazine, and di-(hydroxy-butyl) hydrazine).

11. The method of claim 10 wherein the amount of said hydroxy-(lower alkyl)-hydrazine is between about 5 to 50 wt. %, the amount of water is between about 30 to 90 wt. % and the amount of said carboxylic acid is between about 1 to 40 wt. % based on the total weight of the cleaning composition.

12. The method of claim 9 wherein said hydroxy-(lower alkyl)-hydrazine is hydroxyethyl hydrazine and said carboxylic acid is ethylenediaminetetraacetic acid.

13. The method of claim 1 wherein the amount of said hydroxy-(lower alkyl)-hydrazine is between about 30 to 70 wt. %, the amount of water is between about 1 to 30 wt. % and the amount of said water-miscible solvent is between about 30 to 70 wt. % based on the total weight of the cleaning composition.

14. The method of claim 9, further comprising a water-miscible solvent selected from the group consisting of: N-methyl-2-pyrrolidinone (NMP), N-hydroxyethyl-2-pyrrolidinone, 1,3-dimethyl-2-imidazolidinone, dimethylsulfoxide (DMSO), N,N-dimethylacetamide, diacetone alcohol, ethylene glycol, propylene glycol, and combinations thereof.

15. The method of claim 14 wherein said hydroxy-(lower alkyl)-hydrazine is hydroxyethyl hydrazine and said water-miscible solvent is NMP or DMSO.

16. The method of claim 9 further comprising a surfactant, a corrosion inhibitor or a combination thereof.

17. The method of claim 9 further comprising contacting the substrate with ozonated water.

* * * * *